United States Patent
Akahori (10) Patent No.: US 8,041,322 B2
(45) Date of Patent: Oct. 18, 2011

(54) RF RECEIVER DEVICE

(75) Inventor: Hiroji Akahori, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 473 days.

(21) Appl. No.: 12/359,358

(22) Filed: Jan. 26, 2009

(65) Prior Publication Data

US 2009/0209219 A1 Aug. 20, 2009

(30) Foreign Application Priority Data

Jan. 30, 2008 (JP) .................................. 2008-019026

(51) Int. Cl.
*H04B 1/06* (2006.01)
(52) U.S. Cl. ................. 455/234.1; 455/245.2; 455/253.2
(58) Field of Classification Search ................ 455/232.1, 455/234.1, 235.1, 245.1, 245.2, 250.1, 251.1, 455/253.1, 253.2; 375/345
See application file for complete search history.

(56) References Cited

U.S. PATENT DOCUMENTS

| | | | | |
|---|---|---|---|---|
| 4,355,414 A | * | 10/1982 | Inoue | 455/250.1 |
| 5,745,847 A | * | 4/1998 | Matsuo | 455/234.1 |
| 7,672,654 B2 | * | 3/2010 | Okada | 455/232.1 |
| 2007/0010193 A1 | | 1/2007 | Okada | |

FOREIGN PATENT DOCUMENTS

JP 2002290178 A 10/2002
JP 2007019900 A 1/2007

* cited by examiner

*Primary Examiner* — Quochien B Vuong
(74) *Attorney, Agent, or Firm* — Volentine & Whitt, PLLC (57) ABSTRACT

A radio-frequency receiver includes an RF amplification circuit which amplifies a received RF signal and generates an amplified RF signal, a mixing circuit which converts the amplified RF signal into an intermediate-frequency signal, an IF amplification circuit which generates an amplified IF signal, a first level detection circuit which detects a level of the amplified RF signal, a second level detection circuit which detects a level of the IF signal, a third level detection circuit which detects a level of the amplified IF signal, a RF reference level generation circuit which generates an RF reference level based on one of respective detection signal levels of the first and second level detection circuits, and an RF gain control circuits which controls an amplification gain of the RF amplification circuit so that a detection signal level of the third level detection circuit becomes equal to the RF reference level.

7 Claims, 10 Drawing Sheets

| Output Value S8 | Output Value S10 | Selector Output |
|---|---|---|
| +1 (Decrease) | +1 | +1 |
| +1 | 0 | +1 |
| +1 | -1 | +1 |
| 0 (Do Nothing) | +1 | +1 |
| 0 | 0 | 0 |
| 0 | -1 | -1 |
| -1 (Increase) | +1 | -1 |
| -1 | 0 | -1 |
| -1 | -1 | -1 |

RF RECEIVER DEVICE

BACKGROUND OF THE INVENTION

1. Field of the Invention

The present invention generally relates to the reception of RF (radio-frequency) signals, and more particularly, the present invention relates to an RF receiver device equipped with an automatic gain control function that controls an amplification gain (amplification factor) of a RF amplification stage.

Herein, "radio-frequency" is broadly defined and is not particularly limited. Non-limiting examples include high-signal frequencies for broadcasting of high-definition television (HDTV) signals, such as the ultrahigh frequency (UHF) bands utilized in the Integrated Service Digital Broadcasting—Terrestrial (ISDB-T) standard.

2. Description of the Related Art

Figure 1:
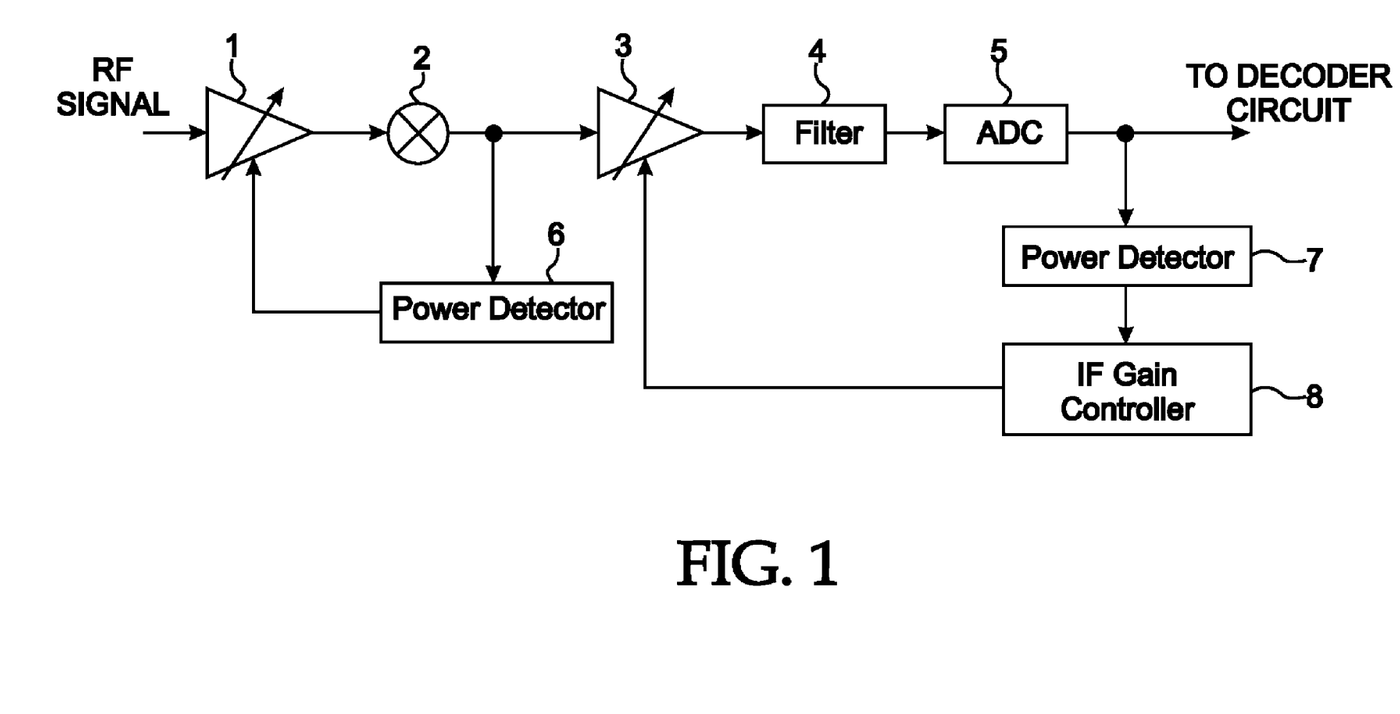
FIG. 1 is a block diagram of a conventional RF RF receiver.

A conventional ISDB-T type RF receiver is illustrated in FIG. 1, and includes an RF variable gain amplifier 1, a mixer 2, an intermediate-frequency (IF) variable gain amplifier 3, a filter 4, an ADC (analog-digital converter) 5, power detectors 6 and 7, and an IF gain controller 8. Receivers of this type are disclosed, for example, in Japanese Patent Application Laid-Open No. 2002-290178 and Japanese Patent Application Laid-Open No. 2007-019900.

The RF variable gain amplifier 1 includes a gain control terminal for varying an amplification gain of an input RF signal received via an antenna (not shown). The resultant amplified RF signal is supplied to the mixer 2, which is configured to mix the supplied RF signal with an oscillation signal generated from a local oscillator to convert the RF signal into an intermediate-frequency (IF) signal. The IF variable gain amplifier 3 includes a gain control terminal for varying the gain the IF signal received from the mixer 2. The filter 4 extracts (passes) intermediate frequency signal components from the output of the IF variable gain amplifier 3. The ADC 5 is configured to convert an analog IF signal output from the filter 4 into a digital IF signal. The digital IF signal is then supplied, for example, to an OFDM decoder circuit (not shown).

The power detector 6 is configured to detect a power level of the IF signal output from the mixer 2, and supply a corresponding gain control signal to the gain control terminal of the RF variable gain amplifier 1. The RF variable gain amplifier 1 changes the amplification gain thereof in accordance with the gain control signal.

Likewise, the power detector 7 is configured to detect a power level of the digital IF signal output from the ADC 5 and to supply corresponding power level detection signal to the IF gain controller 8. The IF gain controller 8 is configured to generate an gain control signal in accordance with the power level detection signal and to supply the gain control signal to the gain control terminal of the IF variable gain amplifier 3. The IF variable gain amplifier 3 changes the amplification gain thereof in accordance with the gain control signal.

By adjusting the respective amplification gains of the RF variable gain amplifier 1 and the IF variable gain amplifier 3, the IF signal can be controlled to a suitable level and supplied to a decoder circuit when an RF signal of a desired channel is received.

Figure 2:
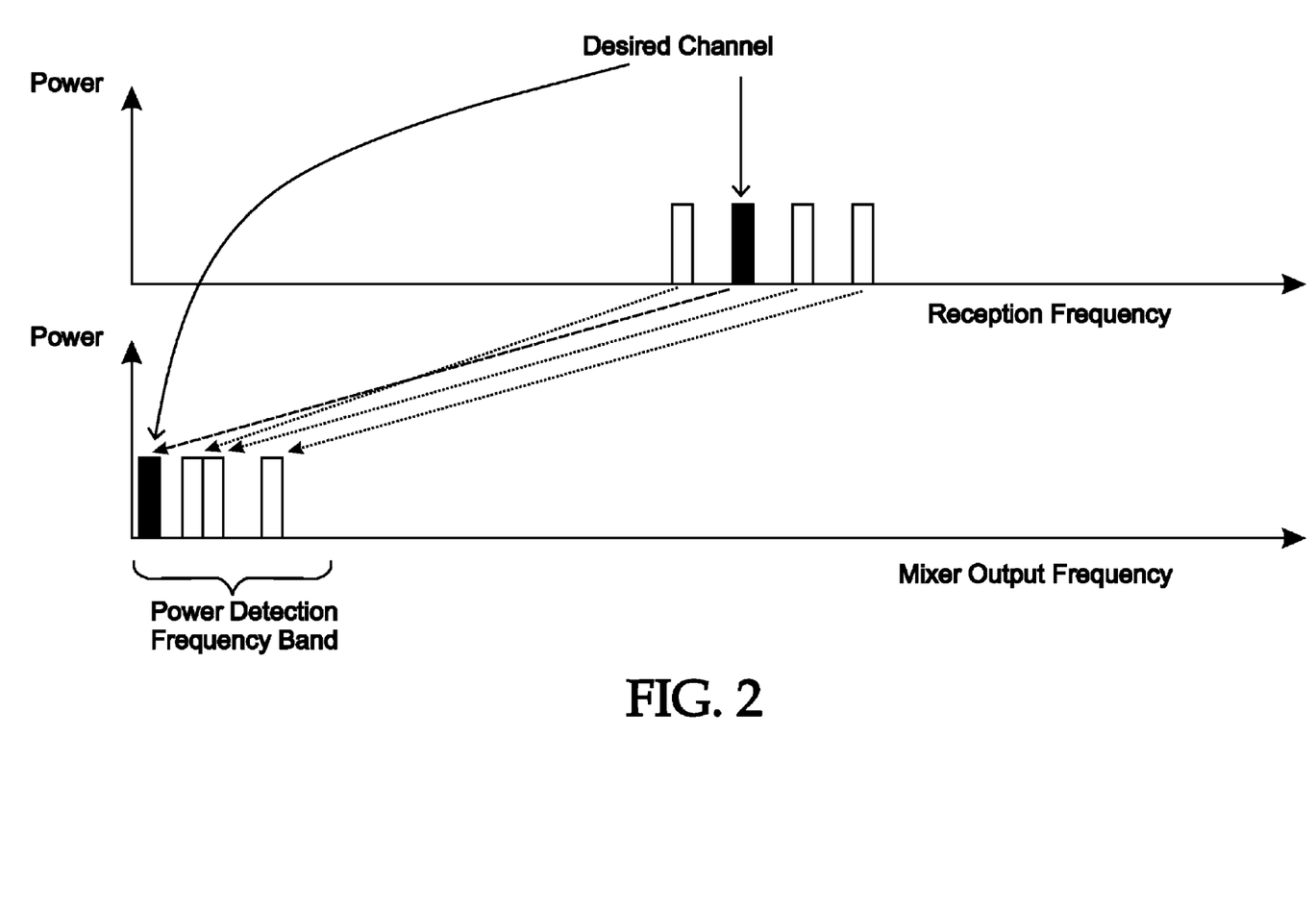
FIG. 2 illustrate reception frequencies and mixer output frequencies of channels in the conventional RF receiver of FIG. 1.

In the conventional RF receiver device, a reception frequency band of the RF variable gain amplifier 1 contains therein a broadcast wave component for each of a plurality of channels, and a broadcast wave component of a desired channel is selected by the mixer 2 from among the plural channels. The broadcast wave component of the desired channel is centered on an intermediate frequency. As illustrated in FIG. 2, the situation can occur in which the reception frequency band of the RF variable gain amplifier 1 further contains therein broadcast wave components of channels adjacent to the broadcast wave component of the desired channel. In such a case, as also illustrated in FIG. 2, in the frequency domain of an output IF signal of the mixer 2, the broadcast wave component of the desired channel, i.e., a broadcast wave component of an intermediate frequency, and broadcast wave components of plural adjacent channels in the vicinity of the desired channel are present. Since the broadcast wave components of the plural adjacent channels are included in a power detection range of the power detector 6, respective power levels of the broadcast wave components within the power detection range are reflected on the power level detection of the power detector 6. Therefore, even when a broadcast wave exhibits a high reception power level, the amplification gain of the RF variable gain amplifier 1 is controlled.

Figure 3:
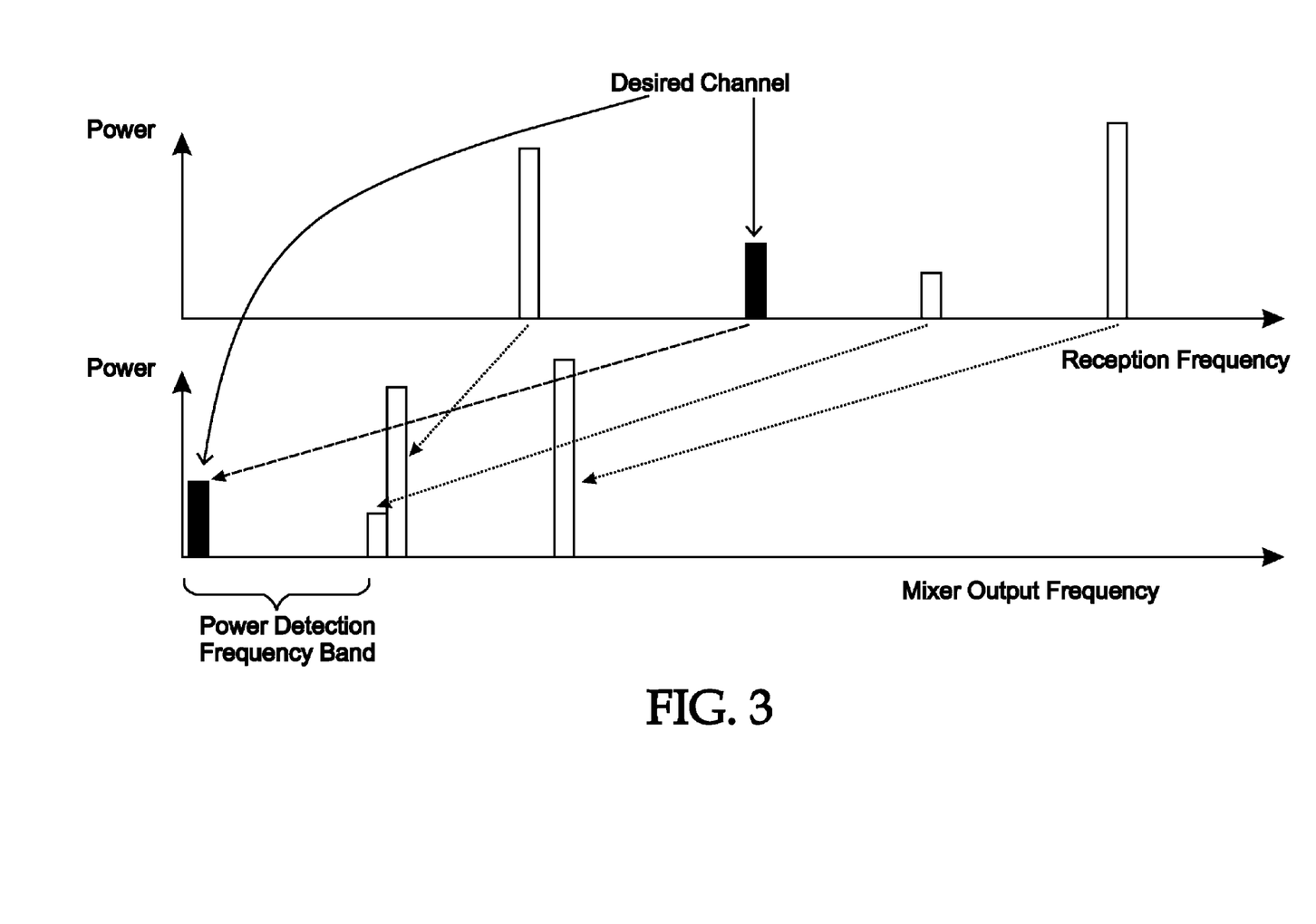
FIG. 3 illustrate reception frequencies and mixer output frequencies of channels in the conventional RF receiver of FIG. 1.

On the other hand, as illustrated in FIG. 3, the situation can occur where the reception frequency band of the RF variable gain amplifier 1 contains therein broadcast wave components of channels distant from, and not adjacent to, the broadcast wave component of the desired channel. In such a case, as also illustrated in FIG. 3, in the frequency domain of the output IF signal of the mixer 2, broadcast wave components of plural channels outside the power detection range of the power detector 6 and distant from the broadcast wave component of the desired channel are present. Since only the broadcast wave component of the desired channel is included in the power detection range of the power detector 6, the power level of only the broadcast wave component of the desired channel is reflected on the power level detection of the power detector 6. Therefore, the amplification gain of the RF variable gain amplifier 1 is controlled in accordance with the power level detection of only the broadcast wave component of the desired channel.

When the reception signal power of the broadcast wave component of a channel distant from the desired channel is large, the RF variable gain amplifier 1 might be saturated with the reception signal power of the distant channel. As a result, the signal component of the desired channel may be distorted, and thus, reception performance may deteriorate.

To overcome this problem, the gain of the RF variable gain amplifier 1 may be set to a low value. However, in this case, when other channels adjacent to the desired channel are present, power levels of other channels other than the desired channel are reflected on the power detection. Therefore, the power of the signal component of the desired channel after having passed through the filter 4 becomes very low, and thus, there may be a case where it is difficult to obtain sufficient signal amplitude for decoding.

On the other hand, in a case where the power detector is provided at an input of the mixer 2 instead of the output of the mixer 2, the gain of the RF variable gain amplifier 1 is controlled by the entire reception power present in the reception frequency band. Therefore, as the sum of the power of other channels present in a region where saturation rarely occurs increases, an amplification factor of the desired channel decreases. As a result, the case can arise in which is difficult to obtain a signal amplitude required for decoding. In an effort to minimize this problem, the gain of the RF variable gain amplifier 1 may be set to a high value. However, in this case, it is not practically possible to detect saturation occurring in the mixer 2, and thus, the RF variable gain amplifier may enter into an unintended saturation state.

SUMMARY OF THE INVENTION

Therefore, it is an object of the present invention to provide an RF receiver device which is capable of controlling a signal component of a desired channel to a suitable level while avoiding or minimizing saturation of a high-frequency amplification stage such as an RF variable gain amplifier.

In accordance with an aspect of the present invention, a radio-frequency (RF) receiver is provide which includes an RF amplification circuit which amplifies a received RF signal and generates an amplified RF signal, a mixing circuit which converts the amplified RF signal into an intermediate-frequency (IF) signal, an IF amplification circuit which amplifies the IF signal and generates an amplified IF signal, a first level detection circuit which detects a signal level of the amplified RF signal, a second level detection circuit which detects a signal level of the IF signal, a third level detection circuit which detects a signal level of the amplified IF signal, a RF reference level generation circuit which generates an RF reference level based on at least one of respective detection signal levels of the first and second level detection circuits, and an RF gain control circuits which controls an amplification gain of the RF amplification circuit so that a value corresponding to a detection signal level of the third level detection circuit becomes equal to the RF reference level.

BRIEF DESCRIPTION OF THE DRAWINGS

The above and other aspect and features of the present invention with become readily apparent from the detailed description that follows, with reference to the accompanying drawings, in which.

DESCRIPTION OF PREFERRED EMBODIMENTS

The present invention will be described below by way of preferred, but non-limiting, embodiments of the invention.

The embodiments presented herein are considered examples of various implementations of the invention, and are not intended to limit or specifically define the overall scope of the invention.

For ease of understanding and to avoid redundancy, like reference numbers refer to the same or similar elements throughout the drawings. Also, while the drawings contain a number of circuit elements, it will be understood from the nature of electrical circuits that when an element is described as being connected to another element, it can be directly connected the other element or one or more intervening elements may be present. In contrast, if an element is referred to as being "directly connected to" another element, then no intervening elements are present. Other words used to describe the relationship between elements should be interpreted in a like fashion (e.g., "between" versus "directly between," "adjacent" versus "directly adjacent," "connected" versus "directly connected," etc.).

As is traditional in the field of the present invention, embodiments of the invention may be described at least partially in terms of functional blocks or units. It will be readily understood that the functional blocks or units denote electronic circuits which are configured (e.g., by dedicated and/or programmable circuitry) to execute the signaling and/or computational operations described herein. Also, it will be readily understood that one or more functional blocks may be physically combined into complex circuitry without departing from the spirit and scope of the present invention.

Figure 4:
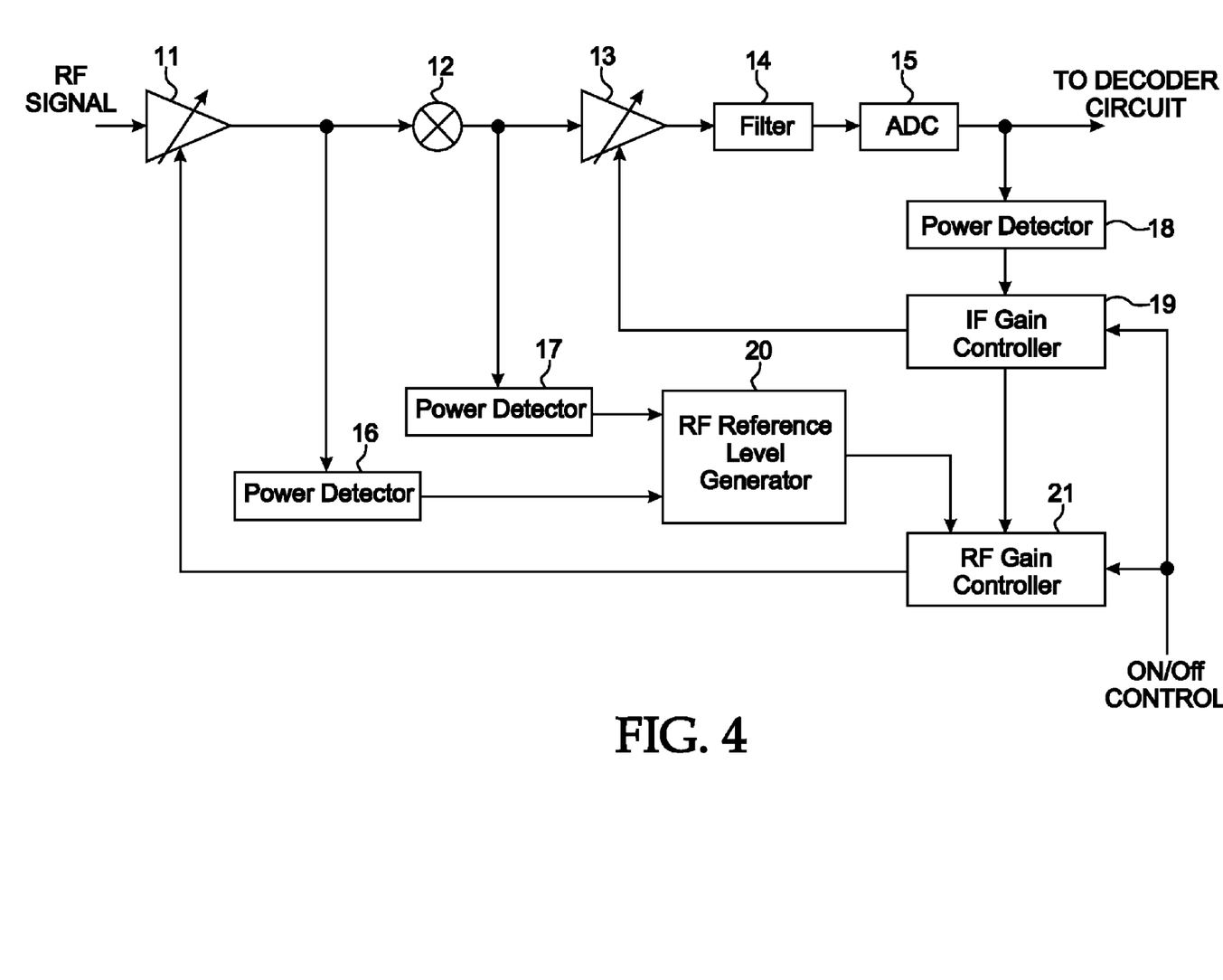
FIG. 4 is a block diagram of RF receiver device according to an embodiment of the present invention.

FIG. 4 illustrates an RF receiver device according to an embodiment of the present invention. The RF receiver device may, for example, be utilized in ISDB-T type terrestrial digital broadcasting.

The RF receiver device of FIG. 4 includes an RF variable gain amplifier 11, a mixer 12, an IF variable gain amplifier 13, a filter 14, an ADC 15, power detectors 16, 17 and 18, an IF gain controller 19, an RF reference level generator 20, and an RF gain controller 21.

The RF variable gain amplifier 11, the mixer 12, the IF variable gain amplifier 13, the filter 14, and the ADC 15 function in the same manner as the RB variable gain amplifier 1, the mixer 2, the IF variable gain amplifier 3, the filter 41 and the ADC 5 described previously in connection with the conventional device illustrated in FIG. 1. Accordingly, a detailed description of these element is omitted here to avoid redundancy.

The power detector 16 is configured to detect a power level of an output RF signal of the RF variable gain amplifier 11, and to supply a corresponding power level detection signal to the RF reference level generator 20. The power detector 17 is configured to detect a power level of an output IF signal of the mixer 12, and to supply a corresponding power level detection signal to the RF reference level generator 20. The power detector 18 is configured to detect a power level of the digital IF signal output from the ADC 15, and to supply a corresponding power level detection to the IF gain controller 19.

The IF gain controller 19 is configured to generate a gain control signal in accordance with the power level detection signal output from the power detector 18, and to supply the gain control signal to the gain control terminal of the IF variable gain amplifier 13.

Figure 5:
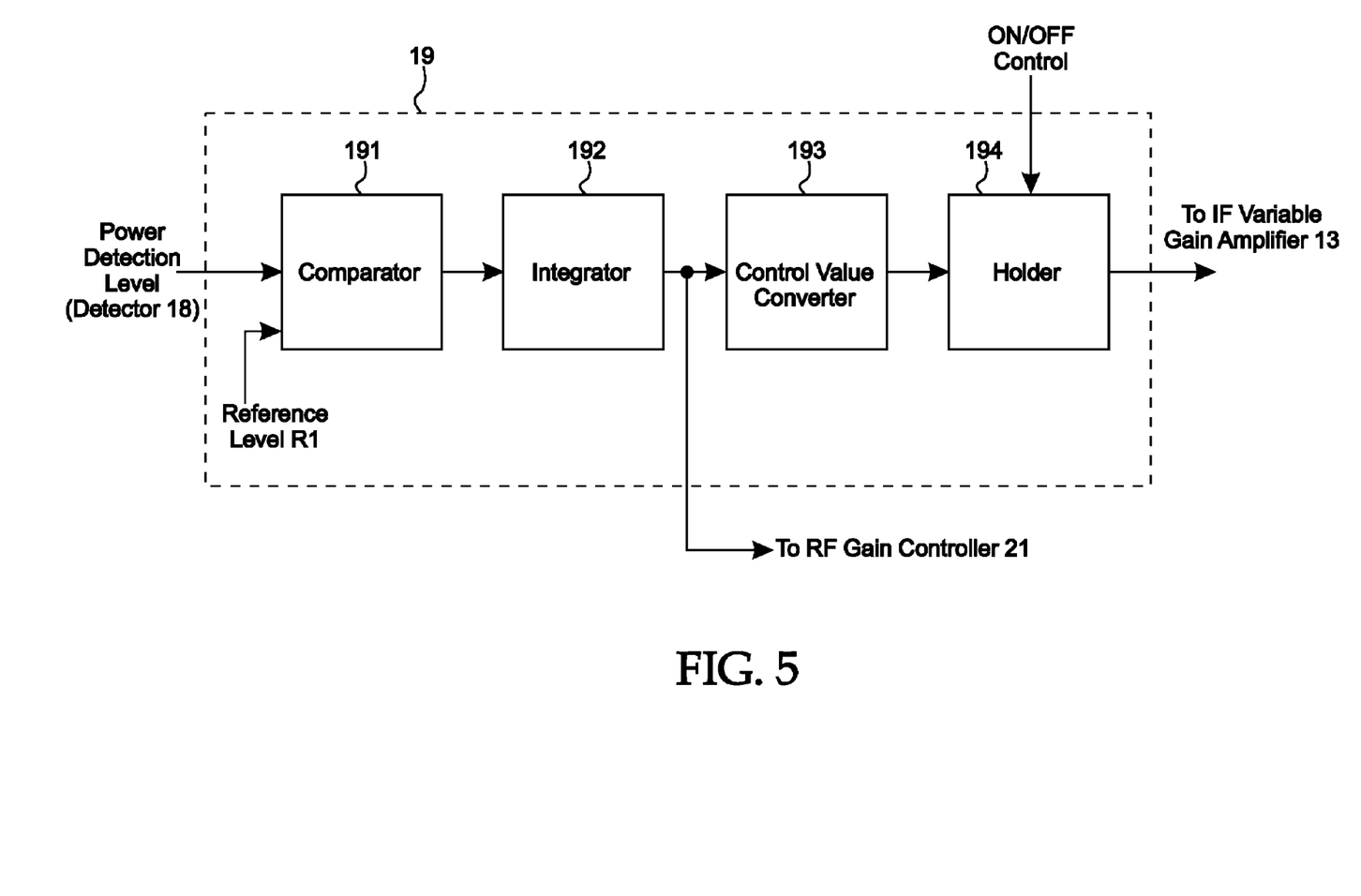
FIG. 5 is a block diagram of an IF gain controller of the RF receiver device of FIG. 4 according to an embodiment of the present invention.

The IF gain controller 19 according to an embodiment of the present invention is shown in FIG. 5. According to the example of FIG. 5, the IF gain controller 19 includes a comparator 191, an integrator 192, a control value converter 193, and a holder 194. The comparator 191 is configured to compare the power level detection signal (from power detector 18) with a reference level R1, and to generate a gain increase signal when the power level detection signal is smaller than the reference level R1, and to generate a gain decrease signal when the power level detection signal is not smaller than the reference level R1. The integrator 192 is configured to integrate an output signal of the comparator 191 at a predetermined time interval. In the example of this embodiment, the gain increase signal output from the comparator 191 is +1 and the gain decrease signal is −1. The control value converter 193 is configured to convert a value of an integration result by the integrator 192 to a control value for the IF variable gain amplifier 13 to thereby generate the gain control signal. For example, when the IF variable gain amplifier 13 has a control voltage range of 0.5 to 2.5 V and a control amount of 20 dB/V and the integrator 192 has an output value range of 0 to 128, a gain control step of the IF variable gain amplifier 13 is adjusted to 0.3125 dB/step (40/128) so that an output value of 0 corresponds to a control voltage of 0.5 V, while an output value of 128 corresponds to a control voltage of 2.5 V.

The holder 194 is normally in a through state (OFF state) where it relays and supplies the gain control signal output from the control value converter 193 to the gain control terminal of the IF variable gain amplifier 13. However, upon reception of an ON control signal from other non-illustrated communication functional blocks within a device containing the RF receiver device, the holder 194 holds the gain control signal that existed immediately before reception of the ON control signal, so that the held gain control signal is supplied to the gain control terminal of the IF variable gain amplifier 13. For example, when other communication functional blocks are in a transmission mode, a gain of the IF variable gain amplifier 13 is fixed to a gain immediately before reception in response to the ON control signal.

Returning to FIG. 4, the RF reference level generator 20 is configured to set a reference level R2 of the RF gain controller 21 based on the respective power level detection signals of the power detectors 16 and 17. In particular, the RF reference level generator 20 is configured to avoid allowing the RF variable gain amplifier 11 to enter into a saturation state.

Figure 6:
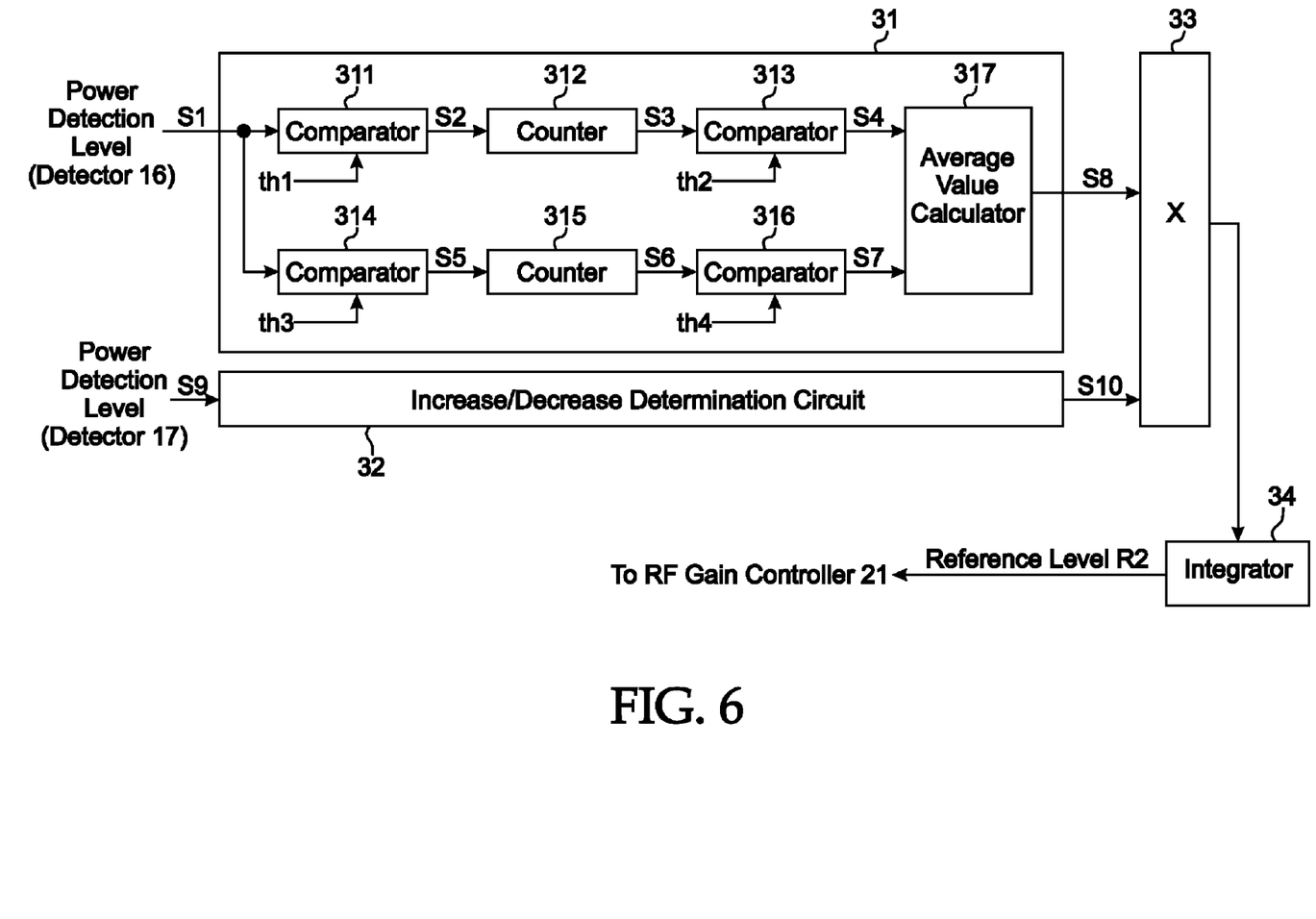
FIG. 6 is a block diagram of a RF reference level generator of the RF receiver device of FIG. 4 according to an embodiment of the present invention.

FIG. 6 illustrates an embodiment of the RF reference level generator 20. As shown in FIG. 6, the RF reference level generator 10 of this example is configured to include first and second increase/decrease determiners 31 and 32, a selector 33, and an integrator 34. The first increase/decrease determiner 31 is provided with comparators 311, 313, 314 and 316, counters 312 and 315, and an average value calculator 317. Although not shown, the second increase/decrease determiner 32 is configured in the same manner as the first increase/decrease determiner 31.

The comparator 311 is configured to compare the power level detection signal of the power detector 16 with a first threshold th1 at a predetermined time interval n. Assuming that the power level detection is S1, the comparator 311 generates an output value S2 representing "1" when S1>th1, and an output value S2 representing "0" is generated when S1≦th1. The counter 312 is configured to count the output value S2 of the comparator 311 obtained at the predetermined time interval n, and to output a count value S3 at a predetermined time interval m. The comparator 313 is configured to compare the count value S3 of the counter 312 with a second threshold th2 at the predetermined time interval m. The comparator 313 generates an output value S4 representing "−1" when S3>th2, and an output value S4 representing "+1" is generated when S3≦th2. In this embodiment, the predetermined time interval m is an integer multiple of the predetermined time interval n.

The comparator 314 is configured to compare the power level detection signal S1 of the power detector 16 with a third threshold th3 at the predetermined time interval n. IN this embodiment, the first and third thresholds satisfy a relationship of th1>th3. The comparator 314 generates an output value S5 representing "1" when S1>th3, and an output value S5 representing "0" is generated when S1≦th3. The counter 315 is configured to count the output value S5 of the comparator 314 obtained at the predetermined time interval n, and to output a count value S6 at the predetermined time interval m. The comparator 316 is configured to compare the count value S6 of the counter 315 with a fourth threshold th4 at the predetermined time interval m. The comparator 316 generates an output value S7 representing "−1" when S6>th4, and an output value S7 representing "+1" is generated when S6≦th4.

The average value calculator 317 is configured to calculate an average value (S4+S7)/2 of the output value S4 of the comparator 313 and the output value S7 of the comparator 316 at the predetermined time interval m, and to output the average value as an output value S8 to the increase/decrease determiner 31. The output value S8 has three values of "−1," "0" and "+1." The output value S8 of "−1" is a gain increase request, "+1" is a gain decrease request, and "0" is a neutral request, i.e., a do-nothing request.

The above-described output values S2 to S8 can be expressed by the following formulae. Here, N is an arbitrary integer.

$$S2_n = \begin{cases} 1 : S1_n > th1 \\ 0 : S1_n \leq th1 \end{cases}$$

$$S5_n = \begin{cases} 1 : S1_n > th3 \\ 0 : S1_n \leq th3 \end{cases}$$

$$S3_m = \sum_{i=0}^{N-1} S2_{n-1}$$

$$S6_m = \sum_{i=0}^{N-1} S5_{n-1}$$

$$S4_m = \begin{cases} -1 : S3_m > th2 \\ +1 : S3_m \leq th2 \end{cases}$$

$$S7_m = \begin{cases} -1 : S6_m > th4 \\ +1 : S6_m \leq th4 \end{cases}$$

$$S8_m = \sum (S4_m + S7_m)/2$$

As mentioned above, the second increase/decrease determiner 32 has the same configuration as the first increase/decrease determiner 31, except that the increase/decrease determiner 32 is supplied with the power level detection of the power detector 17.

The selector 33 is configured to output a selection value in response to the output value of the first increase/decrease determiner 31 and the output value of the second increase/decrease determiner 32 at the predetermined time interval m. The selection value is either the output value of the first increase/decrease determiner 31 or the output value of the second increase/decrease determiner 32 at an arbitrary time point.

Figure 7:
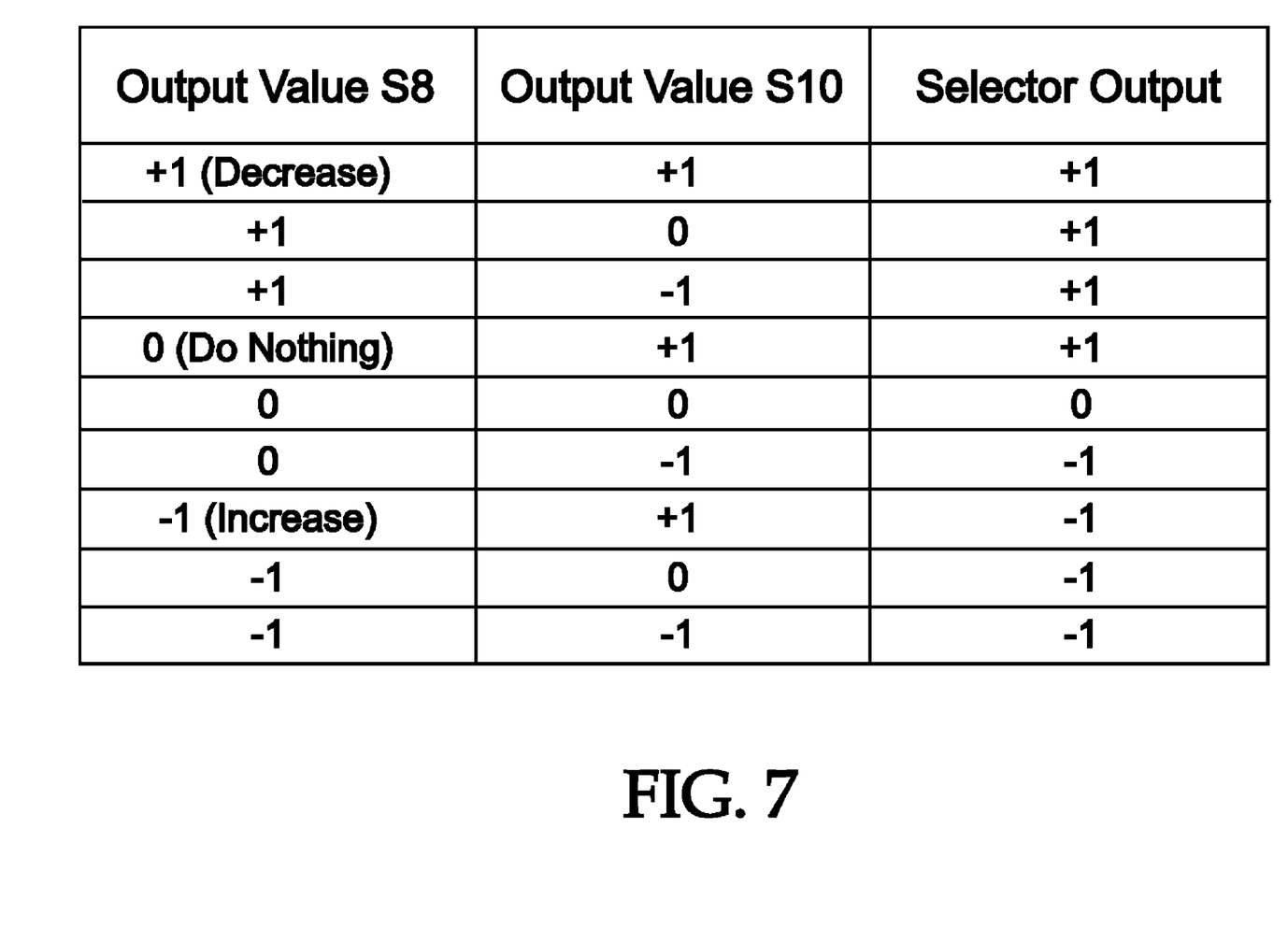
FIG. 7 illustrates an output value table of a selector according to an embodiment of the present invention.

FIG. 7 is a table illustrating an output value table of the selector 33 with respect to the respective output values S8 of the first increase/decrease determiner 31 and the respective output values S10 of the second increase/decrease determiner 32 according to an embodiment of the present invention. In the illustrated example, "−1" is a gain increase request, "+1" is a gain decrease request and "0" is a neutral request, i.e., a do-nothing request.

The integrator 34 is configured to integrate the output value of the selector 33 output at the predetermined time interval m. A value of an integration result by the integrator 34 is used as the reference level R2, which is supplied to the RF gain controller 21 as an output of the RF reference level generator 20.

Returning to FIG. 4, the RF gain controller 21 is configured to generate a gain control signal in accordance with the output value of the integrator 192 within the IF gain controller 19, and to supply the gain control signal to the gain control terminal of the RF variable gain amplifier 11.

Figure 8:
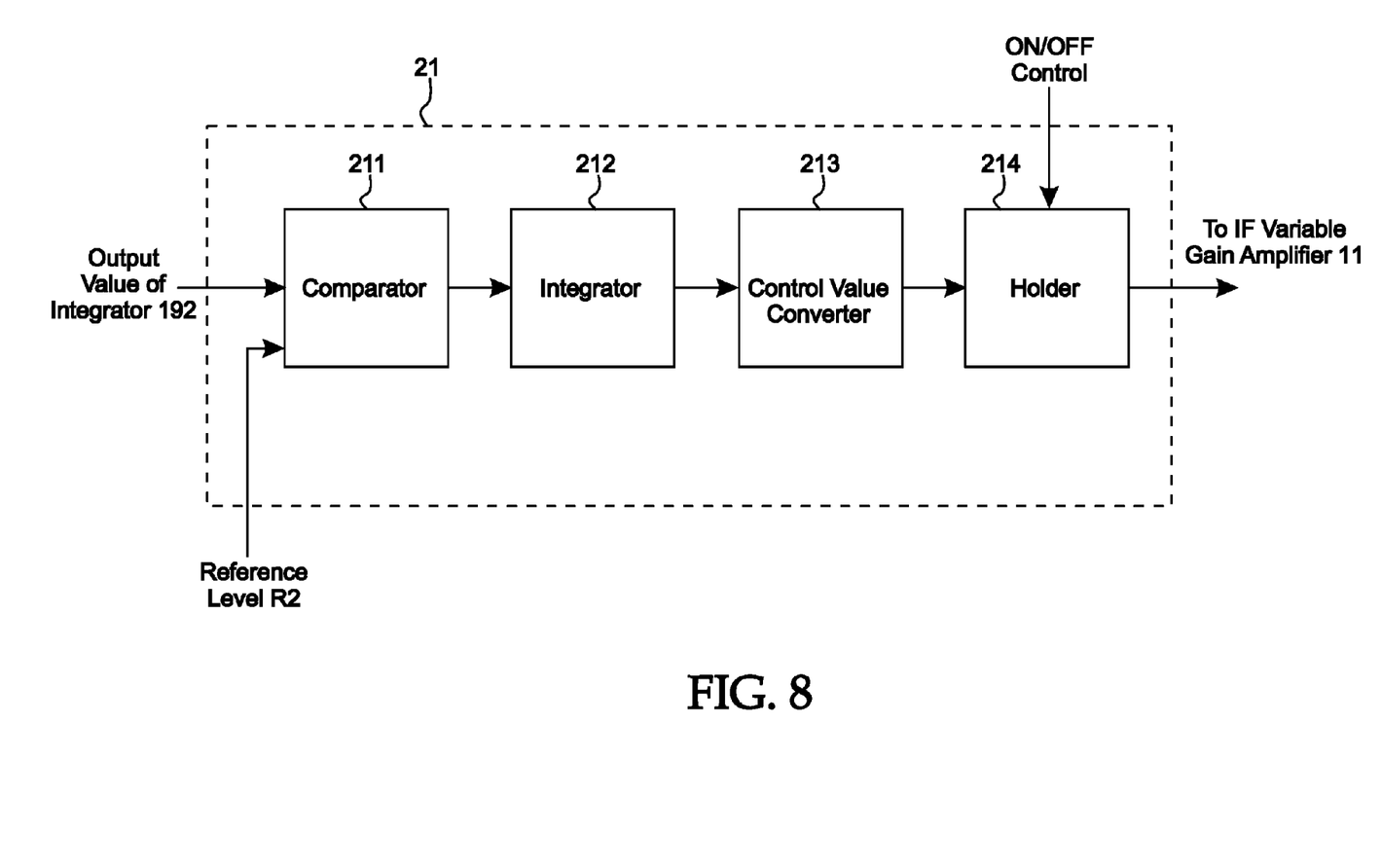
FIG. 8 is a block diagram of an RF gain controller of the RF receiver device of FIG. 4 according to an embodiment of the present invention.

An embodiment of the RF gain controller 21 is illustrated in FIG. 8. That is, the RF gain controller 21 of this example is configured to include a comparator 211, an integrator 212, a control value converter 213, and a holder 214. The comparator 211 is supplied with the output value of the integrator 192 as the value corresponding to the power level detection signal of the IF signal while being supplied with the output value of the integrator 34 as the reference level R2. The gain control signal is supplied from the holder 214 to the gain control terminal of the RF variable gain amplifier 11.

The holder 214 is normally in a through state (OFF state) where it relays and supplies the gain control signal output from the control value converter 213 to the gain control terminal of the RF variable gain amplifier 11. However, upon reception of an ON control signal from other aforementioned communication functional blocks, the holder 214 holds the gain control signal that existed immediately before the reception of the ON control signal so that the held gain control signal is supplied to the gain control terminal of the RF variable gain amplifier 11. When other communication functional blocks are in a transmission mode, a gain of the RF variable gain amplifier 11 is fixed to a gain immediately before the reception in response to the ON control signal.

In the RF receiver device described above, the power level of the digital IF signal output from the ADC 15 is detected by the power detector 18. The power level detection of the power detector 18 is supplied to the IF gain controller 19. In the IF gain controller 19, the power level detection and the reference level R1 are compared with each other by the comparator 191, a comparison result is integrated by the integrator 192, and the output value of the integrator 192 is converted by the control value converter 193, whereby the gain control signal is generated. The gain control signal is supplied to the gain control terminal of the IF variable gain amplifier 13 via the holder 194. Since the IF variable gain amplifier 13 changes its gain in accordance with the gain control signal, the power level of the digital IF signal output from the ADC 15 is adjusted accordingly. In this manner, a first feedback loop is formed, and thus, the power level of the digital IF signal is controlled so as to be equal to the reference level R1 of the comparator 191 by the first feedback loop.

Further, the output value of the integrator 192 is supplied to the RF gain controller 21. In the RF gain controller 21, the output value of the integrator 192 and the reference level R2 generated by the RF reference level generator 20 are compared with each other by the comparator 211, a comparison result is integrated by the integrator 212, and the output value of the integrator 212 is converted by the control value converter 213, whereby the gain control signal is generated. The gain control signal is supplied to the gain control terminal of the RF variable gain amplifier 11 via the holder 214. Since the RF variable gain amplifier 11 changes its gain in accordance with the gain control signal, the power level of the digital IF signal output from the ADC 15 is adjusted accordingly. In this manner, a second feedback loop is formed. A feedback gain of the second feedback loop is smaller than a feedback gain of the first feedback loop. By the second feedback loop, the output value of the integrator 192 is controlled so as to be equal to the reference level R2: that is, the gain of the IF variable gain amplifier 13 is controlled so as to be constant.

In the second feedback loop, the reference level R2 is generated by the RF reference level generator 20. As described above, the RF reference level generator 20 adjusts the reference level R2 based on both or either one of the power level on an input side of the mixer 12 and the power level on an output side thereof.

As the output power level of the RF variable gain amplifier 11 increases so that the RF variable gain amplifier 11 enters into a saturation state, the analog output value S1 of the power detector 16 detecting the power level of the input side of the mixer 12 increases. With the increase in the output value S1 of the power detector 16, the output value S5 of the comparator 314 (in some cases, including the output value S2 of the comparator 311) is inverted from "0" representing a non-saturation state to "1" representing a saturation state. In this way, when both the output value S4 of the comparator 313 and the output value S7 of the comparator 316 become "1," the output value S8 of the increase/decrease determiner 31 becomes "+1". When the analog output value S9 of the power detector 17 detecting the power level on the output side of the mixer 12 increases, the output value S10 of the increase/decrease determiner 32 becomes "+1" by the same operation.

On the other hand, as the output power level of the RF variable gain amplifier 11 decreases, the analog output value S1 of the power detector 16 decreases. With the decrease in the output value S1 of the power detector 16, the output value 55 of the comparator 314 (in some cases, including the output value S2 of the comparator 311) becomes "0" representing a non-saturation state. In this way, when both the output value S4 of the comparator 313 and the output value 57 of the comparator 316 become "0", the output value S8 of the increase/decrease determiner 31 becomes "0" or "−1". When the analog output value S9 of the power detector 17 decreases, the output value S10 of the increase/decrease determiner 32 becomes "0" or "−1" by the same operation.

As will be understood from FIG. 7, when the output value S8 of the increase/decrease determiner 31 is "+1", or when the output value S8 of the increase/decrease determiner 31 is "0" and the output value S10 of the increase/decrease determiner 32 is "+1", the output value of the selector 33 becomes "+1". Since "+1" is a gain decrease request, the value of the integration result of the integrator 34, that is, the reference level R2, decreases. In response to the decrease in the reference level R2, the gain control signal of the RF gain controller 21 decreases the gain of the RF variable gain amplifier 11.

On the other hands when the output value S8 of the increase/decrease determiner 31 is "−1", or when the output value S8 of the increase/decrease determiner 31 is "0" and the output value S10 of the increase/decrease determiner 32 is "−1", the output value of the selector 33 becomes "−1". Since "−1" is a gain increase request, the value of the integration result of the integrator 34, that is, the reference level R2, increases. In response to the increase in the reference level R2, the gain control signal of the RF gain controller 21 decreases the gain of the RF variable gain amplifier 11.

Figure 9:
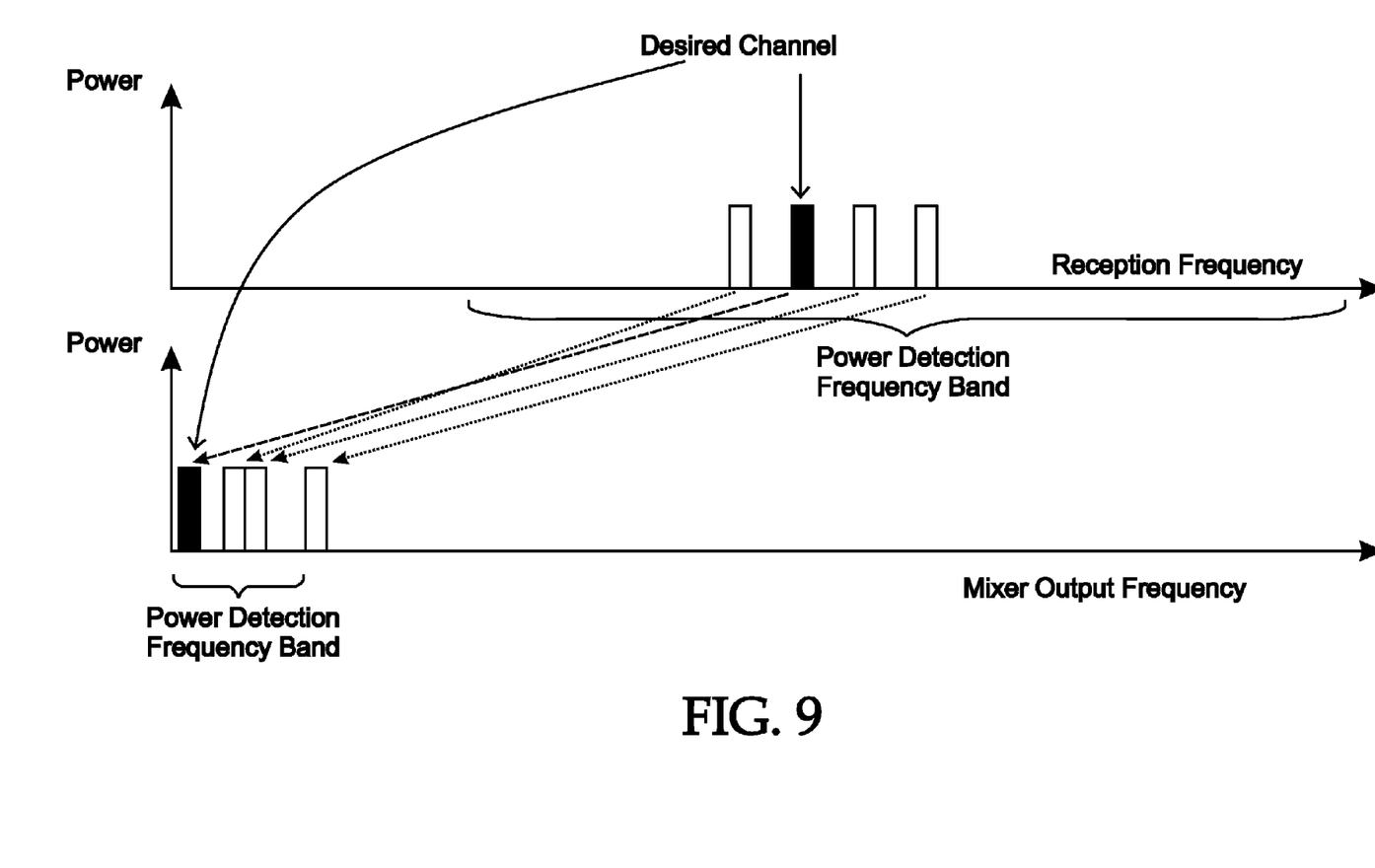
FIG. 9 illustrates reception frequencies and mixer output frequencies of channels in the RF receiver of FIG. 4 according to an embodiment of the present invention.

As illustrated in FIG. 9, a situation can occur where the reception frequency band of the RF variable gain amplifier 11 contains therein broadcast wave components of channels adjacent to the broadcast wave component of the desired channel. In such a case, as also illustrated in FIG. 9, in the frequency domain of an output IF signal of the mixer 12, the broadcast wave component of the desired channel, i.e., a broadcast wave component of an intermediate frequency, and broadcast wave components of plural adjacent channels in the vicinity of the desired channel are present. That is, the broadcast wave component of the desired channel and the broadcast wave components of channels adjacent to the desired channel are included in the power detection frequency band of the power detector 16 detecting the power level on the input side of the mixer 12. Further, the broadcast wave component of the desired channel and the broadcast wave components of channels adjacent to the desired channel are also included in the power detection frequency band of the power detector 17 detecting the power level on the output side of the mixer 12. Therefore, even when there is a broadcast wave of an adjacent channel exhibiting a high reception power level, the amplification gain of the RF variable gain amplifier 11 is suitably controlled.

Figure 10:
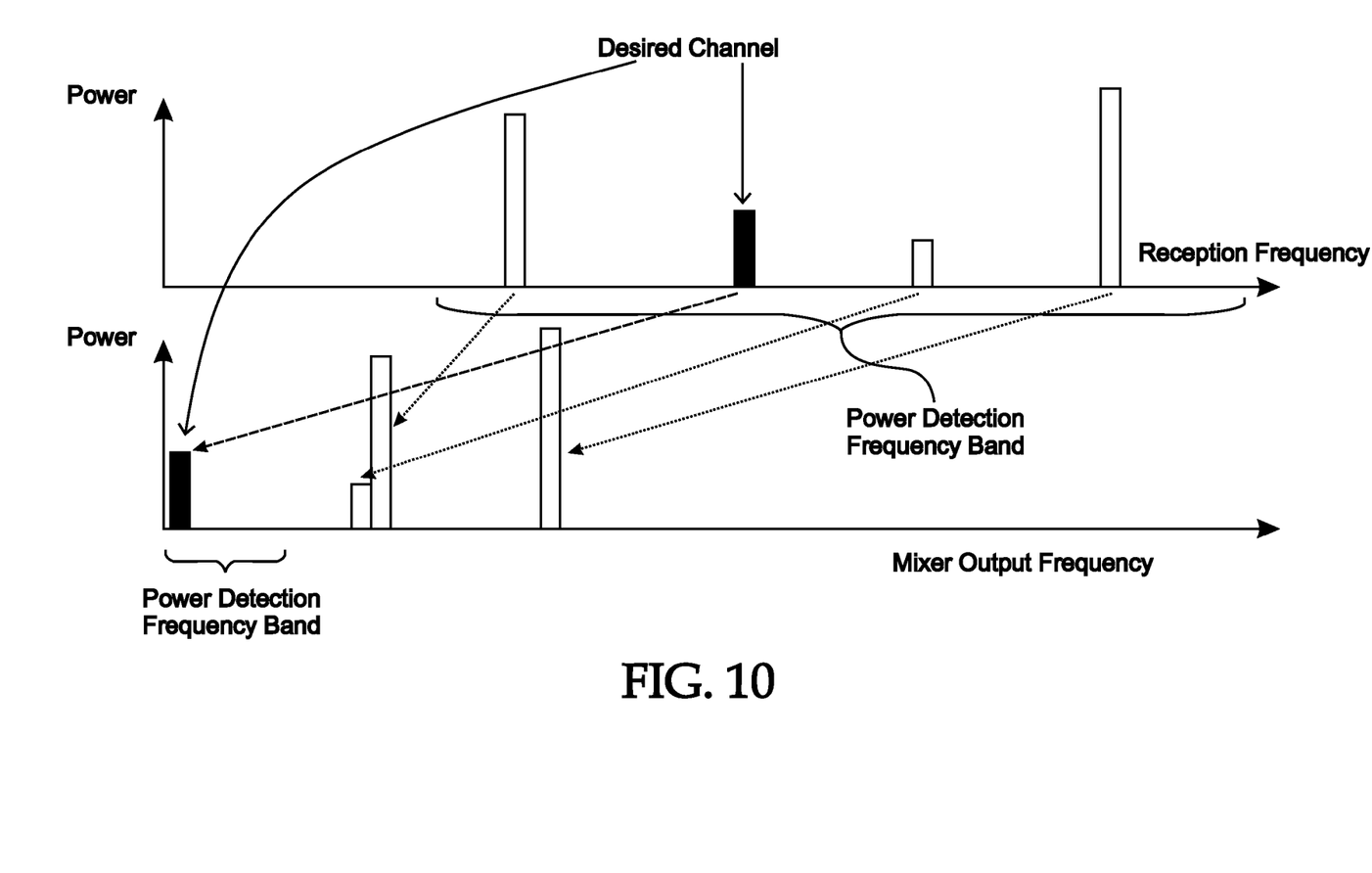
FIG. 10 illustrates reception frequencies and mixer output frequencies of channels in the RF receiver of FIG. 4 according to an embodiment of the present invention.

On the other hand, as illustrated in FIG. 10, another situation can occur in which the reception frequency band of the RF variable gain amplifier 11 contains therein broadcast wave components of channels distant from, and not adjacent to, the broadcast wave component of the desired channel. In such a case, as also illustrated in FIG. 10, in the frequency domain of the output IF signal of the mixer 12, broadcast wave components of plural channels outside the power detection range of the power detector 17 and distant from the broadcast wave component of the desired channel are present. However, in this case, the power detection frequency band of the power detector 16 contains therein the broadcast wave component of the desired channel and the broadcast wave components of channels adjacent to the desired channel. Therefore, since the output value S8 of the increase/decrease determiner 31 becomes "+1" based on at least the increase in the output value S1 of the power detector 16, the reference level R2 decreases, and thus, the gain of the RF variable gain amplifier 11 is decreased. As a result, even when the reception signal power of the broadcast wave component of a channel distant from the desired channel is large, it is possible to prevent saturation of the RF variable gain amplifier 11 by the reception signal power of the distant channel. Accordingly, it is possible to provide favorable reception performance without causing distortion of the signal component of the desired channel.

In the embodiments described above, power detectors are utilized. However, other types of signal level detectors may be utilized, such a voltage detectors capable of detecting signal amplitudes.

Although the present invention has been described in connection with selected embodiments, it is not limited thereto. It will be apparent to those skilled in the art that various substitution, modifications and changes may be thereto without departing from the scope of the invention.

What is claimed is:

1. A radio-frequency (RF) receiver comprising:
   an RF amplification circuit which amplifies a received RF signal and generates an amplified RE signal;
   a mixing circuit which converts the amplified RF signal into an intermediate-frequency (IF) signal;
   an IF amplification circuit which amplifies the IF signal and generates an amplified IF signal;
   a first level detection circuit which detects a signal level of the amplified RF signal;
   a second level detection circuit which detects a signal level of the IF signal;
   a third level detection circuit which detects a signal level of the amplified IF signal;
   a RF reference level generation circuit which generates an RF reference level based on at least one of respective detection signal levels of the first and second level detection circuits; and
   an RF gain control circuits which controls an amplification gain of the RF amplification circuit so that a value corresponding to a detection signal level of the third level detection circuit becomes equal to the RF reference level.

2. The RF receiver device according to claim 1, further comprising IF gain control circuit for controlling an amplification gain of the IF amplification circuit in accordance with the detection signal level of the third level detection circuit.

3. The RF receiver device according to claim 2, wherein the IF gain control circuit comprises:
   a comparator configured to compare the detection signal level of the third level detection circuit with an IF reference level;
   an integrator configured to integrate an output value of the comparator; and
   a control value converter configured to convert the output value of the integrator to a control value,
   wherein the IF gain control circuit supplies an IF gain control signal corresponding to the control value to the IF amplification circuit, and
   wherein the RF gain control circuit receives, as an input thereof, the output value of the integrator as the value corresponding to the detection signal level of the third level detection circuit.

4. The RF receiver device according to claim 2, wherein the RF reference level generation circuit comprises:
   a first increase/decrease determiner configured to make a determination as to an increase, no change, or decrease in the detection signal level of the first level detection circuit at a predetermined time interval to generate a value corresponding to a determination result;
   a second increase/decrease determiner configured to make a determination as to an increase, no change, or decrease in the detection signal level of the second level detection circuit at a predetermined time interval to generate a value corresponding to a determination result;
   a selector configured to select either one of respective output values of the first and second increase/decrease determiners in accordance with a predetermined condition; and
   an integrator configured to integrate an output value selected by the selector to generate the RF reference level.

5. The RF receiver device according to claim 2, wherein when a communication functional block mounted in the RF receiver device is in a transmission mode, the respective amplification gains of the RF amplification circuit and the IF amplification circuit are fixed to a gain immediately before the transmission during the transmission mode.

6. The RF receiver device according to claim 1, wherein the IF gain control circuit comprises:
   a comparator configured to compare the detection signal level of the third level detection circuit with an IF reference level;
   an integrator configured to integrate an output value of the comparator; and
   a control value converter configured to convert the output value of the integrator to a control value,
   wherein the IF gain control circuit supplies an IF gain control signal corresponding to the control value to the IF amplification circuit, and wherein the RF gain control circuit receives, as an input thereof, the output value of the integrator as the value corresponding to the detection signal level of the third level detection circuit.

7. The RF receiver device according to claim 1, wherein when a communication functional block mounted in the RF receiver device is in a transmission mode, the respective amplification gains of the RF amplification circuit and the IF amplification circuit are fixed to a gain immediately before the transmission during the transmission mode.

* * * * *